United States Patent [19]

Ohms

[11] Patent Number: 4,669,023
[45] Date of Patent: May 26, 1987

[54] APPARATUS FOR FREEING ELECTRONIC ONE-WAY SWITCHES FROM HIGH POWER DISSIPATION STRESSES

[75] Inventor: Franz Ohms, Stuttgart, Fed. Rep. of Germany

[73] Assignee: ANT Nachrichtentechnik GmbH, Backnang, Fed. Rep. of Germany

[21] Appl. No.: 662,898

[22] Filed: Oct. 19, 1984

[30] Foreign Application Priority Data

Oct. 22, 1983 [DE] Fed. Rep. of Germany ....... 3338462

[51] Int. Cl.$^4$ ............................................. H03K 17/08
[52] U.S. Cl. ..................................... 361/56; 323/289; 361/91
[58] Field of Search ..................... 323/289; 361/91, 56; 307/542

[56] References Cited

U.S. PATENT DOCUMENTS 4,365,171 12/1982 Archer ................................. 361/91

FOREIGN PATENT DOCUMENTS 2644715 4/1978 Fed. Rep. of Germany .
2905782 3/1983 Fed. Rep. of Germany .
3132512 3/1983 Fed. Rep. of Germany .

OTHER PUBLICATIONS

Thomas A. Radomski, "Protection of Power Transistors in Electric Vehicle Drives", IEEE, 1982, pp. 455–465.

Primary Examiner—Clifford C. Shaw
Attorney, Agent, or Firm—Spencer & Frank

[57] ABSTRACT

A circuit arrangement in combination with an electronic one-way switch connected between a voltage supply and a load, the arrangement freeing the one-way switch of high power dissipation stresses during turn-on and turn-off. The arrangement includes a shunt circuit connected across the one-way switch, the shunt circuit including an inductive storage element and a first capacitive storage element; a free-wheeling diode connected for providing a current path for current through the load when the one-way switch is turned off; a second capacitive storage element connected to the first capacitive storage element; and an auxiliary voltage source connected for charging the second capacitive storage element and for causing the second capacitive storage element to drive a current through the load via the first capacitive storage element after the switch is turned off and before the path provided by the free-wheeling diode begins carrying the current through the load.

2 Claims, 21 Drawing Figures

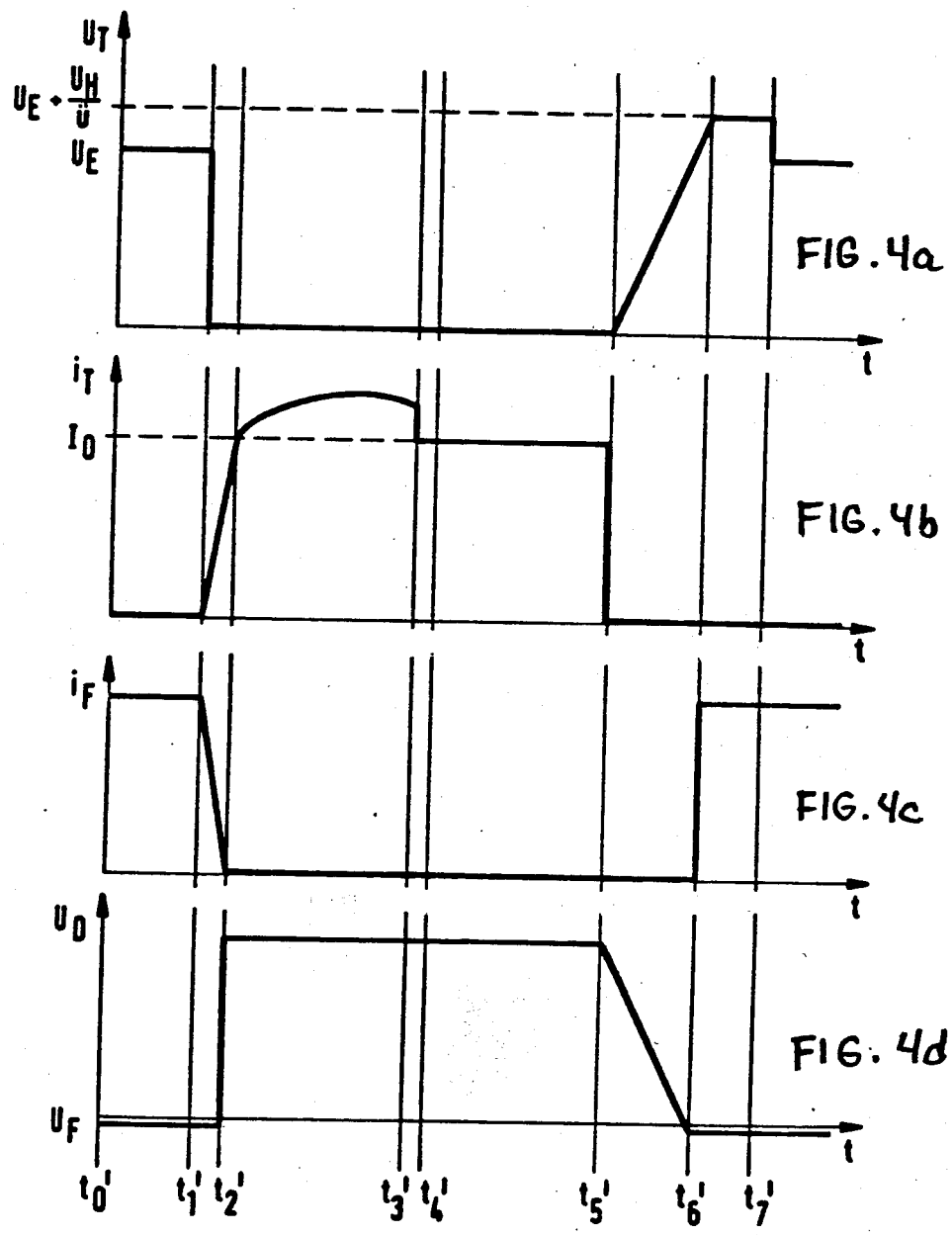

APPARATUS FOR FREEING ELECTRONIC ONE-WAY SWITCHES FROM HIGH POWER DISSIPATION STRESSES

BACKGROUND OF THE INVENTION

The present invention relates to an apparatus for freeing a one-way switch of high power dissipation stresses during turn-on and turn-off, the electronic one-way switch being connected between a voltage source and a load, and wherein an inductive storage element and a capacitive storage element are disposed in a shunt circuit of the electronic one-way switch and a free wheeling diode is provided in the load-side circuit for taking over the load current when the one-way switch is turned off. Such an apparatus is known from German Pat. No. 2,905,782.C2.

Electronic one-way switches must be protected against excessive power dissipation stresses during turn-off, particularly if the switching frequencies are high. For this purpose, it is customary to provide a limiting network in a shunt circuit of the one-way switch. In a no-loss design, this limiting network is composed of inductive and capacitive elements and of diodes; see, for example, "Protection of Power Transistors in Electric Vehicle Drives" by Thomas A. Radomski, 1982, IEEE Conf. Rec., pages 455–465; and German Patent Application No. 2,644, 715.A1. When the one-way switch is turned off, these limiting networks take over the dissipated power in storage elements and thus protect the one-way switch. When the electronic switch is turned on again, these storage elements are recharged and are available to take up energy when the one-way switch is turned off again.

SUMMARY OF THE INVENTION

It is an object of the present invention to design a device of the above type so that the power dissipation stresses on the electronic one-way switch can be further reduced with simple circuitry measures.

The above and other objects are accomplished according to the invention wherein a circuit arrangement is provided in combination with an electronic one-way switch connected between a voltage supply and a load, the arrangement freeing the one-way switch of high power dissipation stresses during turn-on and turn-off. The arrangement includes a shunt circuit connected across the one-way switch, the shunt circuit including an inductive storage element and a first capacitive storage element; a free-wheeling diode means connected for providing a current path for current through the load when the one-way switch is turned off; a second capacitive storage element connected to the first capacitive storage element; and an auxiliary voltage source means connected for charging the second capacitive storage element and for causing the second capacitive storage element to drive a current through the load via the first capacitive storage element after the switch is turned off and before the path provided by the free-wheeling diode begins carrying the current through the load.

In a further embodiment of the invention the device operates in dependence on its load so that the efficiency of the device is not reduced under conditions of partial load or no load as is the case with conventional circuits.

In a further embodiment of the invention, the recovery current of the free-wheeling diode is limited in addition to reducing the power dissipation stresses during turn-on and turn-off of the one-way switch. Moreover, the device according to this embodiment also operates in dependence on its load, i.e. with smaller currents the circuit has less influence. In the prior art no-loss relief circuits, for example as disclosed in German Patent Application No. 2,644,715.A1, problems arise under partial load or no load operation. Efficiency is reduced since the load transfer and thus the power dissipation of the prior art relief circuits remain independent of the load current. These problems are overcome in the present invention by the load-dependent discharge and recharge of the further capacitive storage element. The power dissipation of the relief circuit is not a requirement of the principle involved but originates from diode threshold voltages as well as resistance losses in the components of the relief circuit, parameters which change sometimes in dependence on the load. High magnetization currents to avoid demagnetization problems during no-load operation are no longer required for transformer uses. While in the past, separate circuits were required to reduce power dissipation stresses and to limit the recovery current, current of the free-wheeling diode, this further embodiment of the invention is able to take both measures simultaneously by means of a simple circuit.

The circuits according to the present invention can be used universally, for example for step-down and step-up converters, blocking converters and flux converters, and for push-pull and bridge converters. The device according to the present invention is particularly suitable for one-way switches operating with high switching frequencies, since switching losses are usually particularly high at high frequencies and reduce efficiency.

According to another aspect of the invention, additional reverse recovery currents do not stress the one-way switch. Provision of complicated anti-interference measures against reverse recovery current interruptions connected with voltage peaks and resulting from stray inductances and electromagnetic fields are no longer necessary.

BRIEF DESCRIPTION OF THE DRAWINGS

FIGS. 4a to 4i show signal curves for the switching elements of the circuit of FIG. 3.

DESCRIPTION OF THE PREFERRED EMBODIMENT

Figure 1:
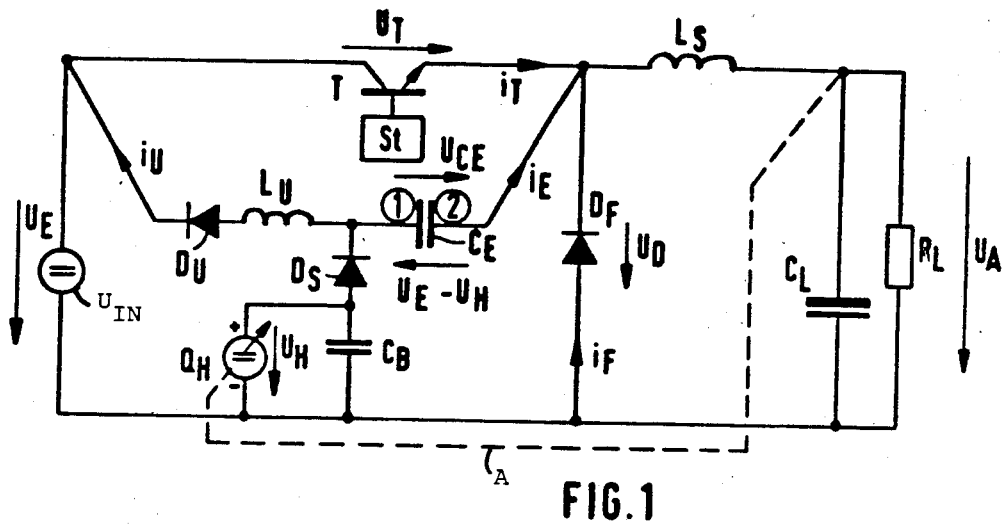
FIG. 1 is a block circuit diagram of a switching device according to the present invention.

FIG. 1 shows a basic circuit according to the present invention. The direct input voltage source $U_{IN}$ provides a d.c. input voltage $U_E$. This direct input voltage $U_E$ is temporarily connected to the load, represented by a load resistor $R_L$, by way of the electronic one-way switch T, here designed as a bipolar transistor. Bipolar transistor T is controlled into conduction by control device St, for example for switch regulation operation. To smooth the current through one-way switch T to load $R_L$, a smoothing choke $L_S$ is connected in series with T and $R_L$. The inductance of this smoothing choke $L_S$ is assumed to be very high. A smoothing capacitor $C_L$ is connected in parallel with load $R_L$. In order for the load current to be able to flow even if one-way switch T is turned off, a free-wheeling diode $D_F$ is connected in parallel with the series connection of $L_S$ and $R_L$, providing a path for the load current during off-time. Such free-wheeling diode circuits are known in the art, e.g. U.S. Pat. No. 3,697,852.

The emitter-collector path of one-way switch T is bridged by the series connection of a first capacitive storage element $C_E$, a reversing (recharging) choke $L_U$ and a diode $D_U$ whose forward direction goes from the emitter to the collector of the one-way switch T. The connecting line between first capacitive storage element $C_E$ and reversing (recharging) choke $L_U$ is coupled to the cathode of a diode $D_S$. The anode of this diode $D_S$ is connected to an electrode of a further capacitive storage element $C_B$. The other electrode of this further capacitive storage element $C_B$ is connected to the anode of free-wheeling diode $D_F$ and with that pole of the d.c. input voltage source $U_{IN}$ which is remote from the collector of one-way switch T. An auxiliary voltage source $Q_H$ which provides an auxiliary voltage $U_H$ is connected in parallel with the further capacitive storage element $C_B$. The positive terminal of $Q_H$ is connected to the anode of diode $D_S$.

Figure 2A:
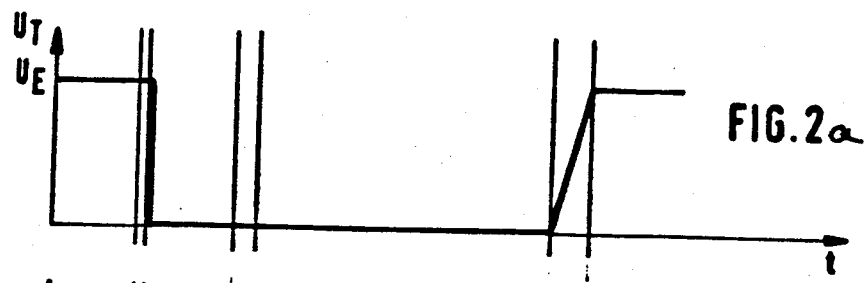
FIGS. 2a to 2f show signal curves for the switching elements of the circuit according to FIG. 1.
Figure 2B:
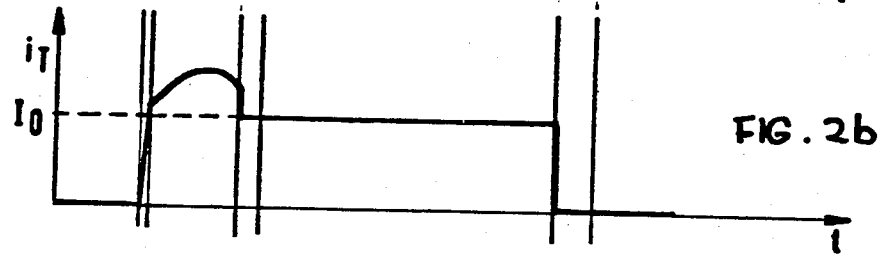
Figure 2C:
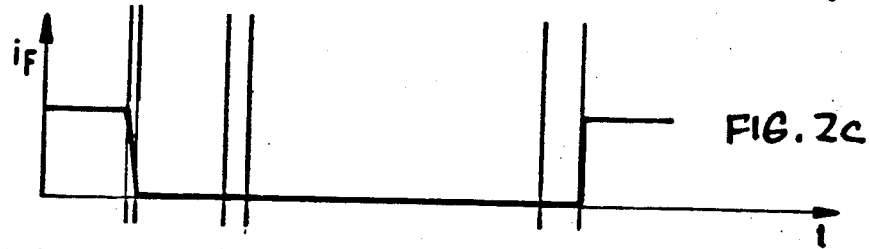
Figure 2D:
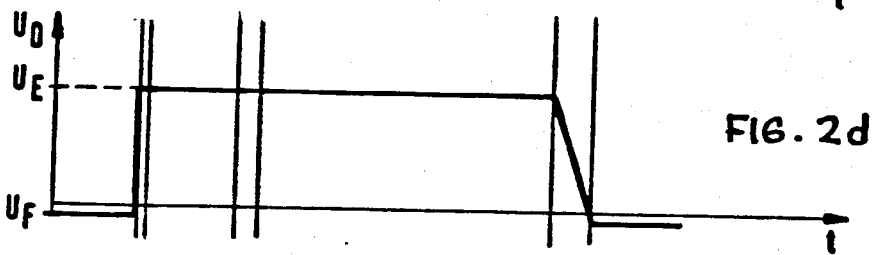

The operation of the circuit of FIG. 1 will now be described with the aid of the signal curves of FIGS. 2a to 2f. It is assumed that at time $t_0$ one-way switch T is open. Voltage $U_T$ across the emitter-collector path of T is the full input voltage $U_E$ as shown in FIG. 2a. At time $t_1$, one-way switch T is closed by way of control device St. A collector-emitter current $i_T$ flows, as shown in FIG. 2b at line $t_1$. Also at time $t_1$ the current $i_F$ through free-wheeling diode $D_F$ ends, as shown in FIG. 2c, and voltage $U_D$ across free-wheeling diode $D_F$ jumps from a negative threshold value $U_F$ to the positive value of input voltage $U_E$, as shown in FIG. 2d. Although current $i_T$ through one-way switch T is building up from time $t_1$ on, the full input voltage $U_E$ is still present across the emitter-collector path of T until time $t_2$, where current $i_T$ reaches the full load current height $I_O$ and thus eliminating voltage $U_E$ across emitter-collector path of one-way switch T.

Figure 2E:
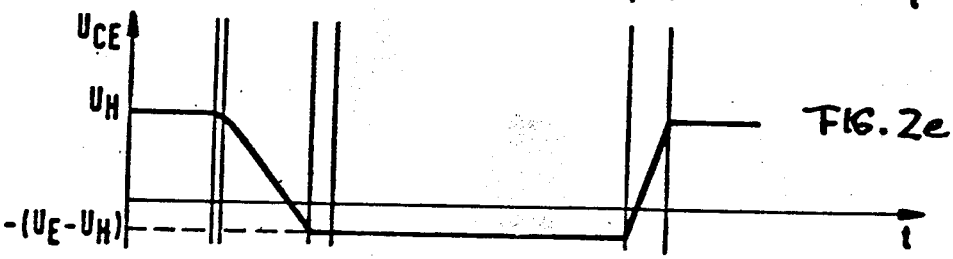
Figure 2F:
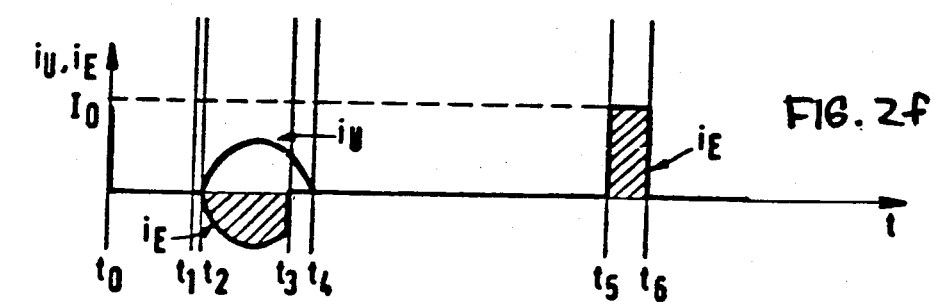

Since capacitor $C_E$ had previously been charged and has the polarity indicated by voltage arrow $U_{CE}$ above capacitor $C_E$, a reversing (recharching) current $i_U$ flows from electrode 1 of capacitor $C_E$ via reversing (recharching) choke $L_U$, diode $D_U$, the collector-emitter path of one-way switch T and back to electrode 2 of capacitor $C_E$. This reversing (recharching) current $i_U$, shown in FIG. 2f, begins to flow at time $t_2$, i.e. when $U_T=0$, until time $t_4$, but only until time $t_3$ does it flow through one-way switch T back to electrode 2 of $C_E$. From $t_3$ to $t_4$, reversing (recharching) current $i_U$, fed by auxiliary voltage source $Q_H$, flows parallel to further capacitor $C_B$, through diode $D_U$ back to the input voltage source, thus resulting in an energy feedback. Time $t_3$ can be set by varying the magnitude of auxiliary voltage $U_H$. Time $t_3$ is defined by that time at which voltage $U_{CE}$ across capacitor $C_E$ is reversed from the positive value $U_H$ to the negative value $(U_E-U_H)$, as shown in FIG. 2e. Current $i_E$ through capacitor $C_E$ thus goes to zero at time $t_3$ as shown in FIG. 2e. During time $t_1$ to $t_3$, current $i_T$ through one-way switch T is composed of load current $I_O$ and current $i_E$. If a criterion, such as a proportional voltage, is obtained from voltage $U_A$ across load $R_L$ for controlling auxiliary voltage source $Q_H$ to vary auxiliary voltage $U_H$, the circuit according to FIG. 1 can be controlled in dependence on its load as shown schematically by dotted line A; that is, the amount of energy fed back is determined by the load.

At time $t_5$, one-way switch T is turned off by means of control device St, at which time current $i_T$ ends. Free-wheeling diode $D_F$, however, does not suddenly take over the load current. Rather, from time $t_5$ to time $t_6$, a current $i_E$ flows, driven by the energy content of capacitor $C_B$. This current $i_E$, shown in FIG. 2f, flows through capacitor $C_B$, diode $D_S$, capacitor $C_E$, choke $L_S$ and load resistor $R_L$ back to capacitor $C_B$. Between $t_5$ and $t_6$ current $i_E$ flows as long as it corresponds to the current/time integral of $i_E$ during the interval from $t_1$ to $t_3$ (load maintenance theorem). During time $t_5$ to $t_6$, voltage $U_{CE}$ across capacitor $C_E$ changes its polarity from $-(U_E-U_H)$ to $U_H$ (see FIG. 2e). Blocking voltage $U_T$ builds up steadily across one-way switch T. The voltage across free-wheeling diode $D_F$ changes from $U_E$ to the negative threshold value $U_F$. From time $t_6$ on, free-wheeling diode $D_F$ takes over the load current and current $i_F$ flows (see FIG. 2c).

As can be seen in FIGS. 2a to 2f, no destructive voltage peak is created when one-way switch T is turned off. The voltage stress on switch T is limited to the value of direct input voltage $U_E$.

Figure 3:
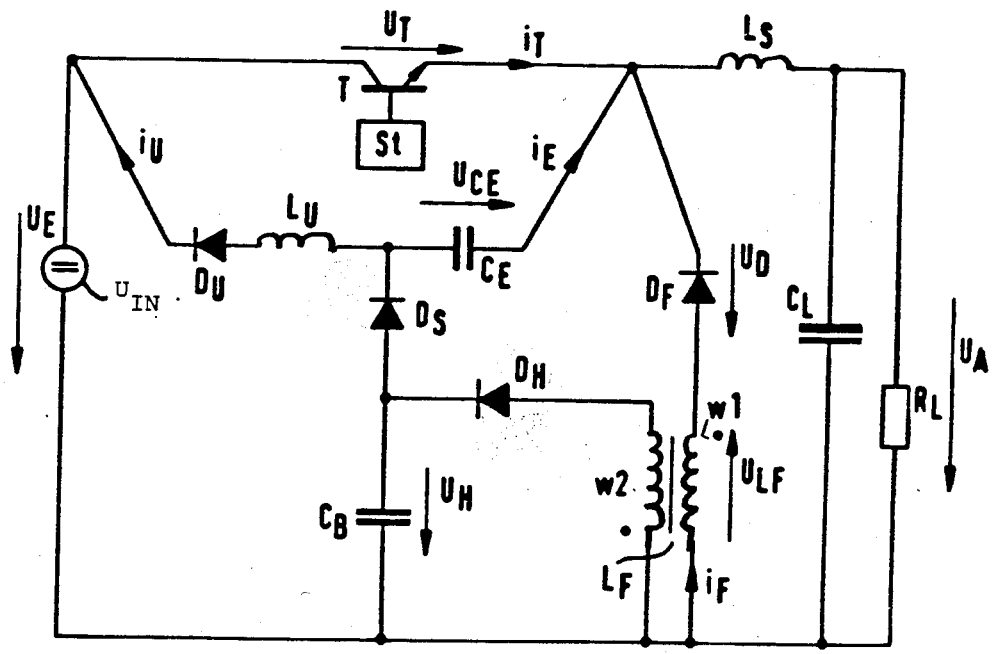
FIG. 3 is a block circuit diagram of another embodiment of the switching device according to the invention.

FIG. 3 shows a circuit according to the present invention with additional advantages. The further capacitive storage element $C_B$ is here not fed by a separate auxiliary voltage source $U_Q$; rather, the auxiliary voltage $U_H$ is generated from the free-wheeling diode circuit. The same circuit elements as in FIG. 1 are connected in parallel with the collector-emitter path of one-way switch T. The further capacitive storage element $C_B$ and diode $D_S$ are also arranged as in FIG. 1. In deviation from FIG. 1, a choke $L_F$ having a primary winding w1 is connected in series with free wheeling diode $D_F$. Furthermore choke $L_F$ has an auxiliary winding w2, thus enabling $L_F$ to operate as a transformer. The auxiliary winding w2 is connected via a diode $D_H$ with the further capacitive storage element $C_B$ in such a manner that the voltage induced in auxiliary winding w2 can be utilized as auxiliary voltage $U_H$ to recharge the further capacitive storage element $C_B$.

Figure 4E:
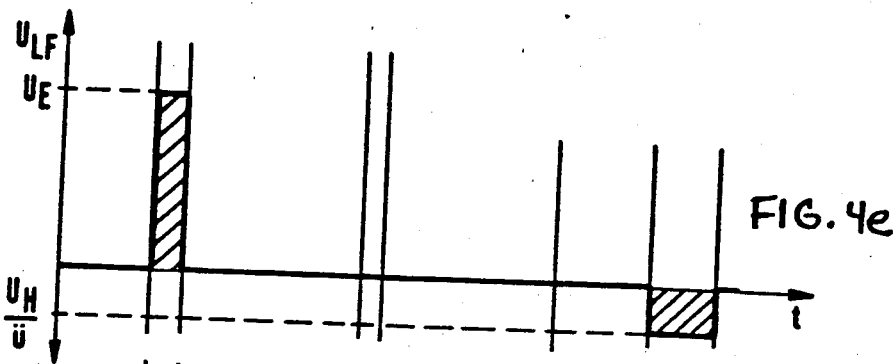
Figure 4F:
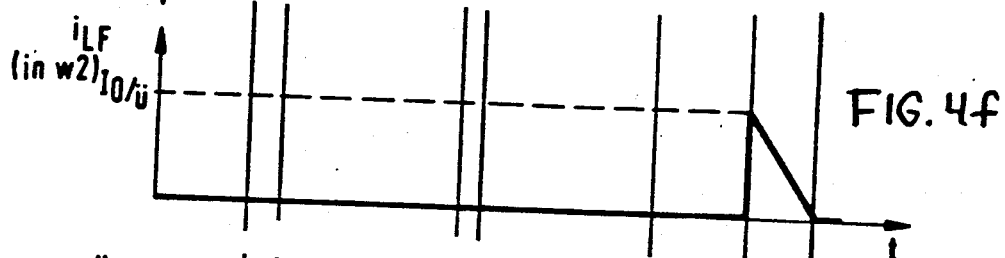

The operation of the circuit according to FIG. 3 will now be described in greater detail with the aid of the signal curves of FIGS. 4a to 4i. At time $t_0'$ one-way switch T is assumed to be open again. Voltage $u_T=U_E$ appears across the emitter-collector path (FIG. 4a). At time $t_1'$, one-way switch T is closed by means of a control pulse from St to its base. The load current $I_O$ is unable to suddenly commutate from the no-load circuit containing diode $D_F$ which conducts current $i_F$ (see FIG. 4c) to the switch circuit containing switch T which conducts current $i_T$ (see FIG. 4b), due to the steadiness of load current $I_O$ through the primary inductance of choke $L_F$.

Figure 4G:
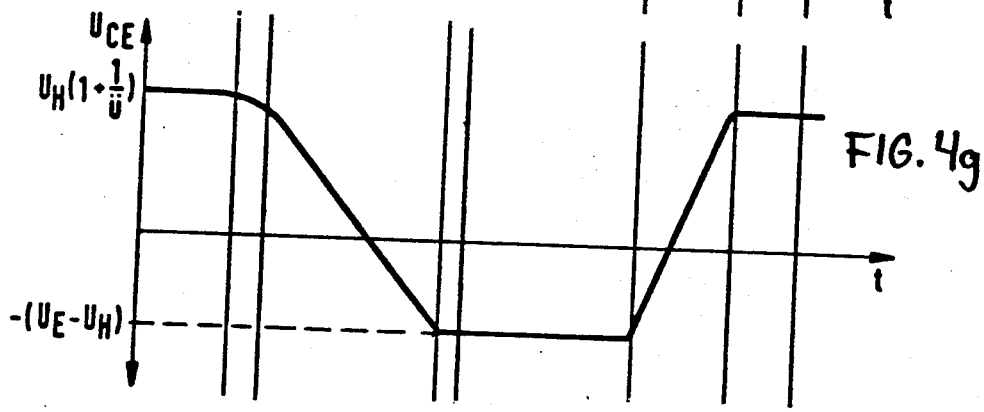
Figure 4H:
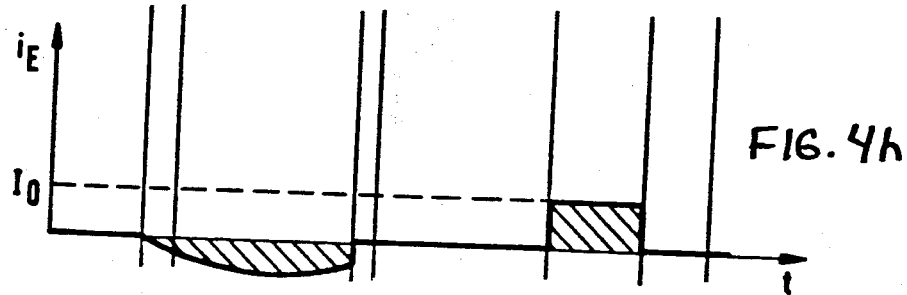
Figure 4I:
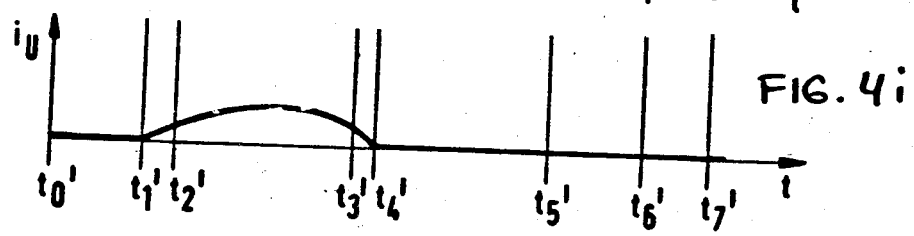

During the time from $t_1'$ to $t_2'$, collector-emitter current $i_T$ increases to the value $I_O$ (FIG. 4b). Current $i_F$ through free-wheeling diode $D_F$, which had a constant value from $t_0'$ to $t_1'$, drops to 0 during the time interval from $t_1'$ to $t_2'$. Beginning at time $t_1'$, capacitor $C_E$ is recharged from voltage $U_H(1 + 1/\ddot{u})$, with ü representing the transformation ratio of windings w2/w1, to voltage $-(U_E-U_H)$ (FIG. 4g). This recharging is completed when the sum voltage $U_{CE}+U_H$ has reached the value of input voltage $U_E$, at time $t_3'$. As in the embodiment of FIG. 1, no current $i_E$ flows through capacitor $C_E$ and one-way switch T after time $t_3'$, (FIG. 4h). Instead, until time $t_4'$, only a current $i_U$ flows through reversing choke $L_U$ and diode $D_U$ to the direct voltage input source (FIG. 4i).

During the interval from $t_1'$ to $t_2'$, voltage $U_{LF}=U_E$ is present across the primary winding of free-wheeling choke $L_F$. At time $t_5'$, one-way switch T is opened by means of St. Current $i_T$ through the one-way switch ends at once (FIG. 4b). Until time $t_6'$, voltage $u_T$ across the collector-emitter path grows steadily from 0 to the value $U_E+ü_H/ü$ (FIG. 4a). Voltage $U_D$ across free-wheeling diode $D_F$ decreases linearly to the negative threshold value $U_F$ (FIG. 4d). During the interval from $t_5'$ to $t_6'$, when current $i_T$ through one-way switch T is terminated, the load current continues as current $i_E$ through capacitor $C_B$, diode $D_S$ and capacitor $C_E$. This discharges capacitor $C_B$.

During this interval from $t_5'$ to $t_6'$, voltage $U_{CE}$ across capacitor $C_E$ is reversed from $-(U_E-U_H)$ to $U_H(1+1/ü)$ (FIG. 4g). Capacitor $C_B$ is preferably selected to be 50 times larger than $C_E$. Since, beginning at time $t_6'$, the transformed intermediate voltage $U_{LF}=U_H/ü$ is present across choke $L_F$ (FIG. 4e), the load current commutates from the relief circuit, current $i_E$ (see FIG. 4h), including capacitor $C_E$, capacitor $C_B$, and diode $D_S$ to the no-load circuit of the free-wheeling diode $D_F$ (current $i_F$, FIG. 4c).

Capacitor $C_B$, fed by the no-load circuit, is now charged via auxiliary winding w2 and diode $D_H$. The impressed intermediate voltage $U_H/ü$ across free-wheeling choke $L_F$ causes the load current to commutate into the primary inductance of free-wheeling choke $L_F$ (current $i_{LF}$, FIG. 4f). This process ends at time $t_7'$. Beginning at time $t_7'$, voltage $u_T$ across the collector-emitter path of one-way switch T goes back to the value of $U_E$.

Auxiliary voltage $U_H$ across the further capacitive storage element $C_B$ sets itself in such a manner that the charge maintenance theorem is met. If the load is small or there is no load, capacitor $C_B$ is charged only insignificantly. Thus, the relief circuit is effective only to a slight degree. This is desirable, since hardly any recharging takes place which would generate power dissipations.

Figure 5:
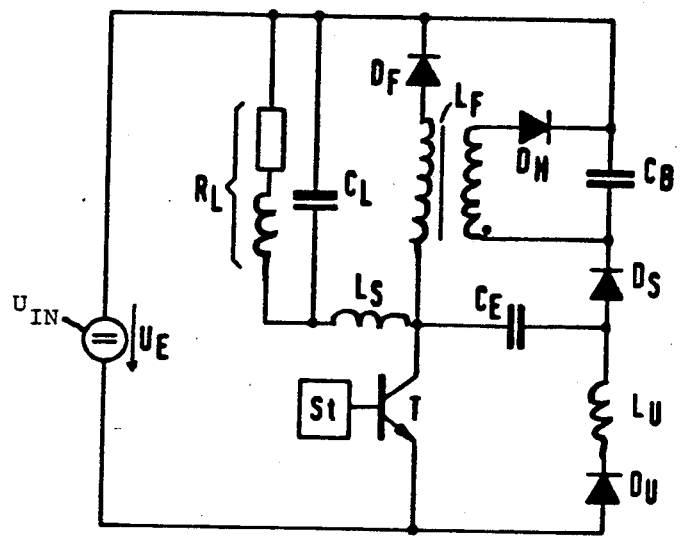
FIGS. 5 to 8 are block circuit diagrams illustrating respective uses of the switching device according to the invention.
Figure 6:
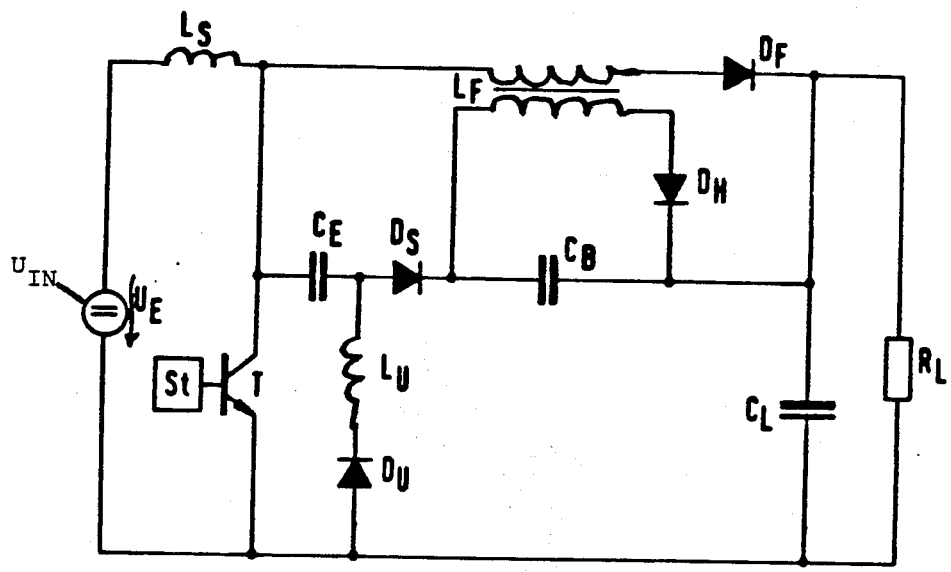

The above embodiments all relate to a one-way switch used for a low-setting device such as a buck or step-down converter. FIG. 5 shows a circuit variation for such a step-down converter. FIG. 6 shows a high-setting device (boost or step-up converter) and FIGS. 7 and 8 show a blocking converter and a flux converter, respectively.

In the step-down converter according to FIG. 5, the direct voltage input source $U_{IN}$ is connected to the series connection of free-wheeling diode $D_F$, the primary winding of choke $L_F$ and the collector-emitter path of one-way switch T. The series connection of smoothing choke $L_S$ and load resistor $R_L$ with parallel connected smoothing capacitor $C_L$ is connected in parallel with the primary winding of free-wheeling choke $L_F$ and free-wheeling diode $D_F$. As in the embodiment of FIG. 3, the collector-emitter path of one-way switch T is bridged by the series connection of capacitor $C_E$, reversing (recharging) choke $L_U$ and diode $D_U$. The anode of diode $D_S$ is connected to the connecting line between $C_E$ and $L_U$ and the cathode of diode $D_S$ is connected to further capacitor $C_B$. Capacitor $C_B$ is bridged by the series connection of the auxiliary winding of $L_F$ and diode $D_H$. The electrode of $C_B$ facing away from diode $D_S$ is connected to the cathode of $D_F$ which is connected to the direct voltage input source $U_{IN}$. Load $R_L$ in the case of FIG. 5 is arranged between the positive electrode of input source $U_{IN}$ and the collector of one-way switch T, whereas in FIG. 3 load $R_L$ is negative electrode of input source $U_{IN}$. Function of the embodiment according to FIG. 5 is quite similar to that of FIG. 3 depending only on application.

In the step-up converter according to FIG. 6, the direct voltage input source $U_{IN}$ is connected in parallel with the series connection of smoothing choke $L_S$ and the collector-emitter path of one-way switch T. The limiting network of $C_E$, $L_U$, $D_U$ is again connected in parallel with the collector-emitter path of T. The primary winding of choke $L_F$ is connected to the connecting line between $L_S$ and the collector of T, and free-wheeling diode $D_F$ and load resistor $R_L$ are again connected in series thereto. The auxiliary winding of choke $L_H$ is connected in parallel with the series connection of $C_B$ and $D_H$. Diode $D_S$ is connected to an electrode of capacitor $C_B$ and to the connecting line which connects $C_E$ and $L_U$. The other electode of $C_B$, to which the cathode of $D_H$ is also connected, leads to the cathode of $D_F$ and to a terminal of $R_L$ and, via smoothing capacitor $C_L$, to the other terminal of $R_L$. Circuitry of the embodiment according to FIG. 6 can be derived from the embodiment of FIG. 5 by just cutting the connection between input source $U_{IN}$ and diode $D_F$, disposing load $R_L$ and capacitor $C_L$ in parallel to the series connection of $C_B$, $D_S$, $L_U$, $D_U$, and then connecting $L_S$ to the positive electrode of input voltage source $U_{IN}$. Function of this embodiment concerning the relief circuitry is also quite similar to the aforementioned devices. Only the application is different (step-down/step-up converter).

Figure 7:
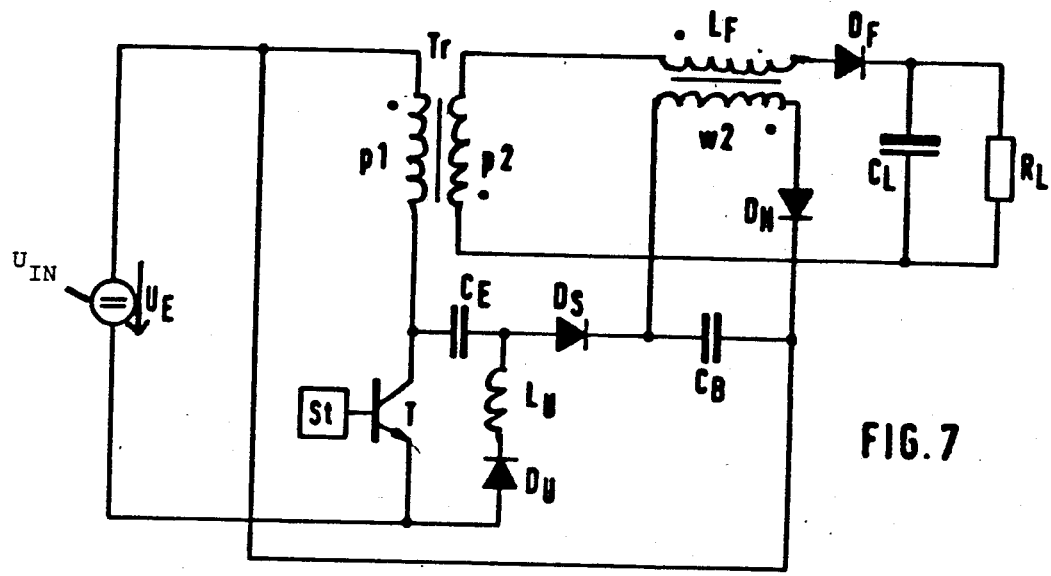
Figure 8:
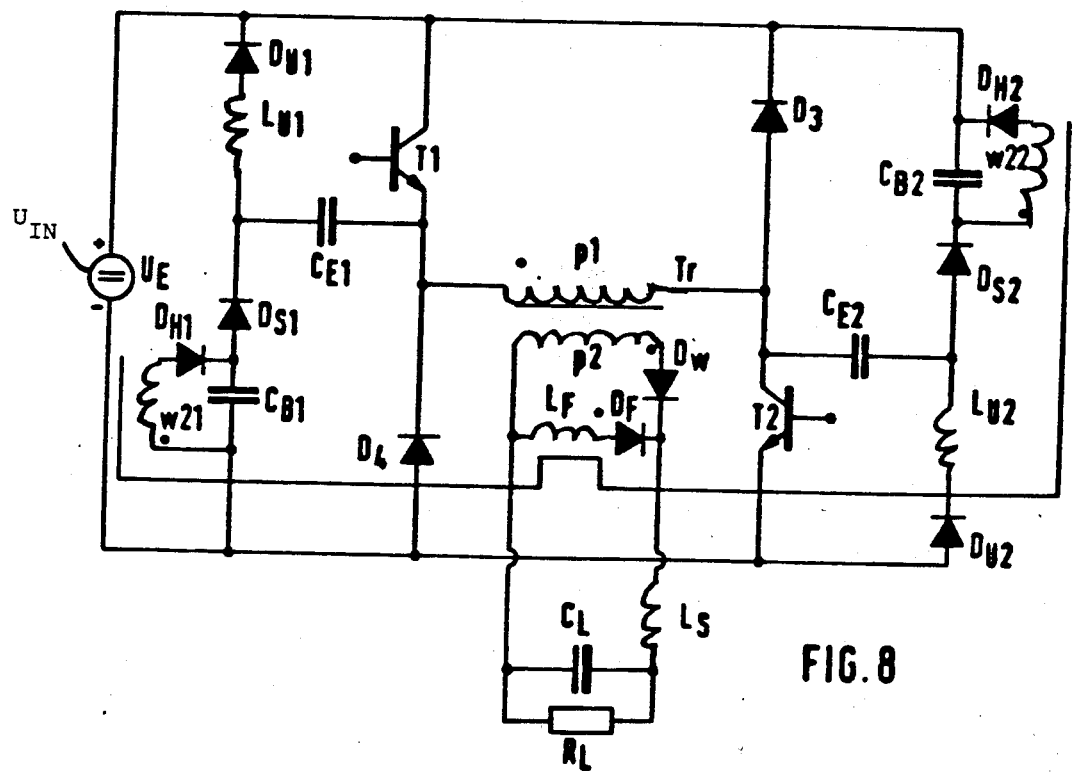

In the blocking converter of FIG. 7, the series-connection of primary winding p1 of blocking converter transformer Tr and the collector-emitter path of one-way switch T are connected in parallel with input voltage source $U_{IN}$. The limiter circuit including $C_E$, $L_U$ and $D_U$ again lies in parallel with the collector-emitter path of T. The secondary winding p2 of blocking converter transformer Tr is connected to load $R_L$ via choke $L_F$ and free-wheeling diode $D_F$. One end of auxiliary winding w2 of $L_F$ is connected, via diode $D_S$, to the connecting line between $C_E$ and $L_U$ and to one electrode of capacitor $C_B$. The other end of winding w2 is connected, via diode $D_H$, to the other electrode of capacitor $C_B$ and to that terminal of direct voltage input source $U_{IN}$ which is adjacent primary winding p1 or Tr. Operation of the blocking converter of FIG. 7 is a little different from the operation of the aforementioned devices. As there is a galvanic seperation of one-way switch T and free-wheeling diode $L_F$ by the transformer Tr, feedback of the energy in the relief circuit to the load is not possible. Feed-back of the energy in the relief circuit here is done to the input voltage source $U_{IN}$.

FIG. 8 shows the use of the device according to the present invention for a flux converter and particularly for a flux converter and half-bridge circuit. One-way switches T1 and T2 are each disposed in one longitudinal branch of the half-bridge circuit. Diodes D3 and D4 supplement the half-bridge circuit and are each connected in series with one of one-way switches T1 and T2. Each one-way switch T1, T2 is provided with a limiter network comprising a capacitor $C_{E1}$ or $C_{E2}$, a reversing choke $L_{U1}$ or $L_{U2}$ and a diode $D_{U1}$ or $D_{U2}$ connected in parallel with its emitter-collector path.

Diode $D_{S1}$ is connected in parallel with the connecting line between $C_{E1}$ and $L_{U1}$ and the electrode of Diode $D_{S1}$ facing away from this connecting line is connected, via diode $D_{H1}$, to a first auxiliary winding w21 of choke $L_F$ and with capacitor $C_{B1}$. Diode $D_{S2}$ is likewise connected to the connecting line between $C_{E2}$ and $L_{U2}$ and its electrode facing away from that connecting line is connected to the cathode of diode $D_H$ via the second capacitor $C_{B2}$ and to the anode of $D_H$ via second auxiliary winding w22 of choke $L_F$. The primary winding p1 of converter transformer Tr is connected in the bridge diagonal of the half-bridge circuit. The secondary winding p2 of converter transformer Tr is connected with load $R_L$ via diode $D_W$ and smoothing choke $L_S$. Free-wheeling diode $D_F$ is connected in series with the primary winding of choke $L_F$ and in parallel with the series connection of p2 and $D_W$.

Operation of flux-converter with half-bridge circuit is similar to the operation of the embodiment according to FIG. 7. Here, energy in every relief circuits is fed back to the input voltage source $U_{IN}$.

In addition to the illustrated possible uses, the device according to the present invention can also be used in many other ways, for example as a combined step-up and step-down converter, a push-pull converter in full bridge connection, and combinations of down converters as inverters.

It will be understood that the above description of the present invention is susceptible to various modifications, changes and adaptations, and the same are intended to be comprehended within the meaning and range of equivalents of the appended claims.

What is claimed is:

1. A circuit arrangement in combination with an electronic one-way switch connected between a voltage supply and a load, said arrangement freeing the one-way switch of high power dissipation stresses during turn-on and turn-off, said arrangement comprising:
   a shunt circuit connected across the one-way switch, said shunt circuit including an inductive storage element and a first capacitive storage element;
   a free-wheeling diode means connected for providing a current path for current through the load when the one-way switch is turned off;
   a choke connected to said free-wheeling diode;
   a second capacitive storage element connected to said first capacitive storage element; and
   an auxiliary voltage source means, including an auxiliary winding connected to said second capacitive storage element and inductively coupled to said choke so that a voltage can be induced by said choke across said auxiliary winding, for charging said second capacitive storage element and for causing said second capacitive storage element to drive a current through the load via said first capacitive storage element after said switch is turned off and before the path provided by said free-wheeling diode begins carrying the current through the load.

2. A circuit arrangement in combination with an electronic one-way switch connected between a voltage supply and a load, said arrangement freeing the one-way switch of high power dissipation stresses during turn-on nd turn-off, said arrangement comprising:
   a shunt circuit connected across the one-way switch, said shunt circuit including an inductive storage element and a first capacitive storage element;
   a free-wheeling diode means connected for providing a current path for current through the load when the one-way switch is turned off;
   a choke connected to said free-wheeling diode;
   a second capacitive storage element connected to said first capacitive storage element; and
   an auxiliary voltage source means, including an auxiliary winding connected to said second capacitive storage element and inductively coupled to said choke so that a voltage can be induced by said choke across said auxiliary winding, for charging said second capacitive storage element and for causing said second capacitive storage element to drive a current through the load via said first capacitive storage element after said switch is turned off and before the path provided by said free-wheeling diode begins carrying the current through the load; and
   wherein said arrangement constitutes one of a buck converter, boost converter, blocking converter and flux converter.

* * * * *